(12) United States Patent
Salmon

(10) Patent No.: US 10,966,338 B1
(45) Date of Patent: Mar. 30, 2021

(54) DENSELY PACKED ELECTRONIC SYSTEMS

(71) Applicant: Peter C. Salmon, Mountain View, CA (US)

(72) Inventor: Peter C. Salmon, Mountain View, CA (US)

(73) Assignee: Peter C. Salmon, Mountain View, CA (US)

( * ) Notice: Subject to any disclaimer, the term of this patent is extended or adjusted under 35 U.S.C. 154(b) by 0 days.

(21) Appl. No.: 16/816,173

(22) Filed: Mar. 11, 2020

(51) Int. Cl.
H05K 3/00 (2006.01)
H05K 7/14 (2006.01)
H05K 1/18 (2006.01)
H05K 3/34 (2006.01)
H05K 7/20 (2006.01)

(52) U.S. Cl.
CPC ........... H05K 7/1487 (2013.01); H05K 1/189 (2013.01); H05K 3/3436 (2013.01); H05K 7/20272 (2013.01); H05K 7/20772 (2013.01); H05K 2201/00 (2013.01); H05K 2201/10378 (2013.01); H05K 2201/10522 (2013.01); H05K 2201/10674 (2013.01)

(58) Field of Classification Search
None
See application file for complete search history.

(56) References Cited

U.S. PATENT DOCUMENTS

| 4,114,275 | A | 9/1978 | Jones et al. |
| 4,124,338 | A | 11/1978 | Mitchell |
| 4,309,365 | A | 1/1982 | Van Ness et al. |
| 4,341,518 | A | 7/1982 | Wallace |
| 4,366,802 | A | 1/1983 | Goodine et al. |
| 4,419,300 | A | 12/1983 | Van Ness et al. |
| 4,534,803 | A | 8/1985 | Asano et al. |
| 4,551,787 | A | 11/1985 | Mittal et al. |
| 4,585,293 | A | 4/1986 | Czeschka et al. |
| 4,669,529 | A | 6/1987 | Evertz |
| 4,677,528 | A | 6/1987 | Miniet |
| 4,765,400 | A | 8/1988 | Chu et al. |
| 4,928,207 | A | 5/1990 | Chrysler et al. |
| 4,973,247 | A | 11/1990 | Varnes et al. |
| 4,975,058 | A | 12/1990 | Woodward |
| 4,978,548 | A | 12/1990 | Cope et al. |

(Continued)

Primary Examiner — Courtney L Smith
(74) Attorney, Agent, or Firm — Jennifer Hayes; Nixon Peabody LLP

(57) ABSTRACT

Components selected from bare die, surface mount devices and stacked devices are assembled using flip chip assembly methods on a printed circuit board assembly (PCBA) with no components having a mounted height exceeding a preferred height. The preferred height may correspond with the components having the highest power rating, because the most effective thermal coupling to a heat sinking surface will then be provided to these high-power components. A blade server is configured with the back face of high-power components coupled to a metal tank carrying cooling water. An electronic system has laminate blocks comprising repeated laminations of PCBAs coupled to metal foils. The laminate blocks are coupled to heat sink surfaces in direct contact with cooling liquid. Power density is superior to existing high-performance computing (HPC) systems and data center servers.

9 Claims, 13 Drawing Sheets

(56) References Cited

U.S. PATENT DOCUMENTS

| | | | |
|---|---|---|---|
| 4,993,229 A | 2/1991 | Baus et al. |
| 5,028,988 A | 7/1991 | Porter et al. |
| 5,074,787 A | 12/1991 | Tsukada |
| 5,088,924 A | 2/1992 | Woodward |
| 5,145,370 A | 9/1992 | Woodward |
| 5,155,661 A | 10/1992 | Nagesh et al. |
| 5,214,570 A | 5/1993 | Shah et al. |
| 5,283,446 A | 2/1994 | Tanisawa |
| 5,323,292 A | 6/1994 | Brzezinski |
| 5,465,192 A | 11/1995 | Yoshikawa |
| 5,476,572 A | 12/1995 | Prough |
| 5,478,778 A | 12/1995 | Tanisawa |
| 5,501,077 A | 3/1996 | Davis et al. |
| 5,514,906 A | 5/1996 | Love et al. |
| 5,555,579 A | 9/1996 | Wu et al. |
| 5,700,355 A | 12/1997 | Prough |
| 5,717,608 A | 2/1998 | Jensen |
| 5,778,677 A | 7/1998 | Hung et al. |
| 5,800,170 A | 9/1998 | Tsukada |
| 5,859,763 A | 1/1999 | Nam et al. |
| 5,897,610 A | 4/1999 | Jensen |
| 5,968,314 A | 10/1999 | Prough |
| 6,126,099 A | 10/2000 | Fachinger et al. |
| 6,126,883 A | 10/2000 | Troetscher et al. |
| 6,210,262 B1 | 4/2001 | Burch et al. |
| 6,251,466 B1 | 6/2001 | McGuire et al. |
| 6,404,640 B1 | 6/2002 | Ishimine et al. |
| 6,452,789 B1 | 9/2002 | Pallotti et al. |
| 6,467,679 B2 | 10/2002 | Kyomasu et al. |
| 6,491,202 B1 | 12/2002 | Kyomasu et al. |
| 6,528,878 B1 | 3/2003 | Daikoku et al. |
| 6,601,295 B2 | 8/2003 | Maekawa |
| 6,621,707 B2 | 9/2003 | Ishimine et al. |
| 6,644,058 B2 | 11/2003 | Bash et al. |
| 6,664,627 B2 | 12/2003 | Cheon |
| 6,817,204 B2 | 11/2004 | Bash et al. |
| 6,853,554 B2 | 2/2005 | Bash et al. |
| 6,882,533 B2 | 4/2005 | Bash et al. |
| 6,890,799 B2 | 5/2005 | Daikoku et al. |
| 7,069,737 B2 | 7/2006 | Wang et al. |
| 7,144,792 B2 | 12/2006 | Wilmot et al. |
| 7,240,500 B2 | 7/2007 | Bash et al. |
| 7,455,094 B2 | 11/2008 | Lee et al. |
| 7,658,614 B2 | 2/2010 | Wilmot et al. |
| 7,659,141 B2 | 2/2010 | Chung-Long-Shan et al. |
| 7,738,250 B2 | 6/2010 | Wu et al. |
| 7,902,666 B1 | 3/2011 | Hsu et al. |
| 7,946,465 B2 | 5/2011 | Silverbrook et al. |
| 7,952,191 B2 | 5/2011 | Sunohara et al. |
| 7,988,033 B2 | 8/2011 | Chung-Long-Shan et al. |
| 8,685,833 B2 | 4/2014 | Khanna et al. |
| 9,142,533 B2 | 9/2015 | Shen et al. |
| 9,214,416 B1* | 12/2015 | Furnival | H01L 23/49844 |
| 9,257,751 B2 | 2/2016 | Felic et al. |
| 9,493,102 B2 | 11/2016 | Tang et al. |
| 9,773,755 B2 | 9/2017 | Shen et al. |
| 10,249,503 B2 | 4/2019 | Yoon et al. |
| 10,336,599 B2 | 7/2019 | Miles |
| 10,461,009 B2* | 10/2019 | Hung | H01L 23/49822 |
| 2001/0042777 A1 | 11/2001 | Kyomasu et al. |
| 2003/0000552 A1 | 9/2003 | Bratten et al. |
| 2003/0151130 A1 | 12/2003 | Cheon |
| 2006/0244926 A1 | 4/2006 | Shih et al. |
| 2007/0240785 A1 | 10/2007 | Lee |
| 2007/0256773 A1 | 11/2007 | Huang |
| 2009/0185343 A1 | 7/2009 | Wu |
| 2010/0275971 A1 | 11/2010 | Zingher |
| 2011/0192172 A1 | 8/2011 | Delacruz |
| 2012/0165908 A1 | 6/2012 | Kou et al. |
| 2012/0217772 A1 | 8/2012 | Tang |
| 2013/0228898 A1* | 9/2013 | Ide | H01L 25/18 |
| | | | 257/621 |
| 2016/0155682 A1* | 6/2016 | Ahuja | H01L 23/36 |
| | | | 257/717 |
| 2017/0015477 A1 | 1/2017 | Miles |
| 2017/0254574 A1 | 1/2017 | Miles |
| 2017/0292782 A1 | 10/2017 | Joyer et al. |
| 2018/0170744 A1 | 6/2018 | Petersen et al. |
| 2018/0315730 A1* | 11/2018 | Gill | H01L 23/3114 |
| 2018/0320937 A1 | 11/2018 | Deng et al. |
| 2019/0041104 A1 | 2/2019 | Yin |
| 2019/0041105 A1 | 2/2019 | Yin |
| 2019/0377391 A1 | 12/2019 | Chen |
| 2020/0027809 A1* | 1/2020 | Hung | H01L 23/42 |
| 2020/0091111 A1* | 3/2020 | Eugene Lee | H01L 23/49575 |
| 2020/0243429 A1* | 7/2020 | Lai | H01L 23/5385 |

* cited by examiner

140

141
fabricating an inner structure within an outer tank wherein the inner structure comprises at least one laminate block and each laminate block comprises a repeated lamination of a printed circuit board assembly and a metal foil;

142
for each repeated lamination coupling the metal foil to a heat sinking surface;

143
circulating a liquid coolant in passages provided between the inner structure and the outer tank, to include flowing liquid coolant past the heat sinking surface.

FIG. 14

DENSELY PACKED ELECTRONIC SYSTEMS

TECHNICAL FIELD

This invention relates to the field of electronic system heat dissipation and more specifically to water cooled printed circuit board assemblies, blade servers and electronic systems.

BACKGROUND

Rack mounted servers employ processors and supporting devices mounted on rigid printed circuit boards. High-power chips are usually sold as packaged devices that are mounted on printed circuit boards. The packaged devices consume considerably more space than the original die contained within the package. Mounting bare die on a printed circuit board can provide a higher chip density but this requires improved heat dissipation.

In the prior art, a CRAY E5-4669v4 supercomputer uses up to 384 64-bit Intel Xeon processors running at 2.2 GHz, and each processor can include up to 22 cores. The volume of the compute cabinet is 176,929 cubic inches, and the volume of the blower cabinet is 60,669 cubic inches for a total volume of 237,598 cubic inches. Power consumed by the compute cabinet is 90 kW in the maximum configuration. The density of processors per unit system volume is $384/237,598$ in$^3$ or 0.0016 processors/in$^3$.

Also in the prior art is the HP PROLIANT BL460cG8 blade server. It has dimensions of 2.2-inch wide, 7.1-inch high, and 20.4-inches deep. It employs dual INTEL OCTA-CORE XEON E5-2660v4 processors running at 2.2 GHz. Each processor die has an area of 306.2 square millimeters and each packaged processor has an area of 2,362 square millimeters. The blade server uses a single printed circuit board having an area of 140 square inches. The number of packaged processor chips per unit system volume is $2/319$ in$^3$=0.0063 processors/in$^3$.

Also in the prior art is a GOOGLE water-cooled device used in data centers. Tensor processing unit (TPU v3) incorporates application specific processors tailored for acceleration of artificial intelligence (AI) applications. A third-generation device was announced on May 8, 2018. Tubes carry cooling water to packages comprising high power devices. The packaged devices are mounted on a printed circuit board.

There is a need in the art for server electronics having increased spatial and power densities, wherein the thermal environment is configured to support higher levels of cooling power.

SUMMARY

In accordance with a first aspect of the invention, a printed circuit board assembly (PCBA) includes electronic components assembled on a substrate using flip chip assembly methods. Using a wide variety of assembly options, it can be arranged that none of the components mounted on the PCBA have a height greater than a preferred height. The electronic components mounted on the substrate may be selected from bare die, surface mount devices, and stacked devices as non-limiting examples. Stacked devices may comprise an interposer or a chiplet or an embedded multi-die interconnection bridge (EMIB). A planarizing filler may be disposed between the components of the PCBA. The outer envelope of the PCBA may have the shape of a rectangular prism, with the back side of mounted devices at or near the outer envelope for the most effective cooling; this geometric shape may be particularly apparent when the PCBA is filled with the planarizing filler. The substrate may include traces that connect with terminals of a PCBA connector.

In accordance with a second aspect of the invention a lamination may be formed by coupling the PCBA with a metal member using a thermal interface material. When the PCBA is coupled with the metal member, the back face of a high-power component having the preferred mounted height will have a short thermal path to a heat sinking surface (the metal member), wherein the separation between them comprises only a thin layer of thermal interface material. Thus, the cooling performance will be optimized for the high-power component.

In accordance with a third aspect of the invention a method for assembling a printed circuit board assembly is described. The method includes the steps of: providing a printed circuit board, selecting components to be mounted on the printed circuit board from bare die, surface mount devices, and stacked devices, mounting the selected components on the printed circuit board using flip chip assembly methods, and thermally coupling back faces of the selected components to a heat sinking surface using a thermal interface material. The selected components may be ranked according to their rated power and assembly methods may be selected for assembling the ranked components wherein back faces of selected components having a higher rated power have preferably a higher height when mounted on the printed circuit board than back faces of selected components having a lower rated power. The selection of components and assembly methods may be iterated to improve a correlation of component power to component height. A filler may be disposed between and atop the selected components such as to cover all of the selected components. A grinding or a polishing process may be applied to remove filler material and semiconductor material as required to achieve a polished planar surface having at least some of the back faces of selected components exposed, prior to thermally coupling the polished planar surface to the heat sinking surface using thermal interface material.

In accordance with a fourth aspect of the invention, a blade server comprises a printed circuit board assembly (PCBA) thermally coupled to a metal tank. The PCBA comprises a plurality of bare die rather than packaged devices. The bare die may be provided with flip chip terminals. Surface mount devices (SMDs) may also be mounted on the PCBA. Stacked devices that may comprise an interposer or a chiplet may also be mounted on the PCBA. A filler may serve to planarize the PCBA, filling holes or gaps around the components. The mounted components are cooled by bonding the back side of each component against a wall of a tank in which liquid coolant is circulated. Depending on the height of a mounted component, a thin layer of filler material may cover the back side of the component; however, at the preferred mounting height there will be no covering of filler material and cooling will be optimized. The tank has a water input and a water output for circulating coolant water. The PCBA may include at least one connector for connecting external signals and power. The blade server may have a rated power consumption exceeding 16 watts per cubic inch of blade server volume.

In accordance with a fifth aspect of the invention, an electronic system comprises an inner structure, wherein the inner structure includes repeated laminations, each lamination comprising a PCBA and a metal foil. Each PCBA may include a PCBA connector having terminals that are coupled to corresponding terminals of a front-panel connector or a rear-panel connector which may provide external signals and power. The laminations may be assembled into one or more laminate blocks. The metal foil may be an alloy of copper. The PCBA may include bare die that are flip chip mounted on each side of a printed circuit board (PCB). The bare die may include processor die and may further include memory die, communication-related die, power-related die, or any other die. Surface mount devices (SMDs) and stacked devices may also be mounted on the PCB. Stacked devices may comprise an interposer or a chiplet or an embedded multi-die interconnection bridge (EMIB). The PCB may be flexible (a flex circuit) and may include a looped portion for mounting at least one connector whose terminals are connected to corresponding terminals of a front or rear panel connector, for connecting external signals and power. The electronic system may be configured with an outer tank enclosure having water inputs and outputs and may operate while the inner structure is substantially immersed in water. The outer tank enclosure may have dimensions of approximately 19 inches wide, 17.5 inches high, and 36 inches long. A base of the inner structure may include extended edges of metal foils that are connected to a base plate. Each end of each block of the inner structure may include an end plate to which extended edges of copper foils are connected. The connections to the base plate and the end plates may be soldered connections. The base plate and the end plates effectively seal against water intrusion into the inner structure. The baseplate may have supporting fins for supporting the inner structure within the outer tank enclosure. The electronic system may include one or more inner tanks disposed between laminate blocks and configured to carry water or other liquid coolant. The electronic system may support a total power consumption exceeding 150 watts per cubic inch of system volume, while maintaining junction temperatures in the PCBA mounted components at a safe temperature, not to exceed 150° C. for example.

In accordance with a sixth aspect of the invention a method for manufacturing and deploying an electronic system comprises fabricating an inner structure within an outer tank wherein the inner structure comprises at least one laminate block and each laminate block comprises a repeated lamination of a printed circuit board assembly and a metal foil. For each repeated lamination, the metal foil is coupled to a heat sinking surface. A liquid coolant is circulated in passages provided between the inner structure and the outer tank, including circulation of coolant past the heat sinking surface. One or more inner tanks configured for circulating coolant may be disposed between laminate blocks. The electronic system may be coupled to external signals and power through a front or rear panel connector.

BRIEF DESCRIPTION OF THE DRAWINGS

The accompanying drawings, which are incorporated into and constitute a part of this specification, illustrate prior art and examples of embodiments. The examples of embodiments, together with the description of example embodiments, serve to explain the principles and implementations of the embodiments.

FIG. 14 is a flow chart of an exemplary process for manufacturing and deploying an electronic system in accordance with an embodiment of the present disclosure.

DETAILED DESCRIPTION

In embodiments of the present disclosure printed circuit board assemblies (PCBAs) comprise mounted components selected from bare die, surface mount devices, and stacked devices. A stacked device may include an interposer or a chiplet or an embedded multi-die interconnection bridge (EMIB). A stacked device may also include an organic substrate having a redistribution layer; this may be described as "fan-out RDL". Components within stacked devices may be interconnected using through silicon vias (TSVs) or embedded multi-die interconnect bridges (EMIBs). Other heterogeneous integration structures may be used, providing the back faces of active die are presented to a heat sinking surface in accordance with a preferred height strategy. All components mounted on a PCBA of the present disclosure have a preferred maximum height, described herein as the preferred height. Preferably the highest power components are mounted at or near the preferred height, because that mounted height corresponds with the most effective thermal coupling to a heat sinking surface. An algorithm may be used to predetermine the preferred height, wherein the components to be used are first ranked according to their power rating, then matching assembly techniques selected, iterating as required. In some applications, processors will be the components having the highest power rating, and they may also require a stacked structure because of fan-out considerations, so the preferred height may correspond to a stacked processor component. Any suitable preferred height may be used. The preferred height may be any value or range of values selected between about 0.5 mm and 3.0 mm. It will be appreciated that the preferred height may be less than 0.5 mm or greater than 3.0 mm. In one particular example, the preferred height is 2.5 mm.

A blade server is configured with the back face of high-power components coupled to a metal tank carrying cooling water. An electronic system has laminate blocks comprising repeated laminations of PCBAs coupled to metal foils. The laminate blocks are thermally coupled to heat sink surfaces in direct contact with cooling liquid. Power density is superior to existing high-performance computing (HPC) systems and data center servers.

Figure 1:
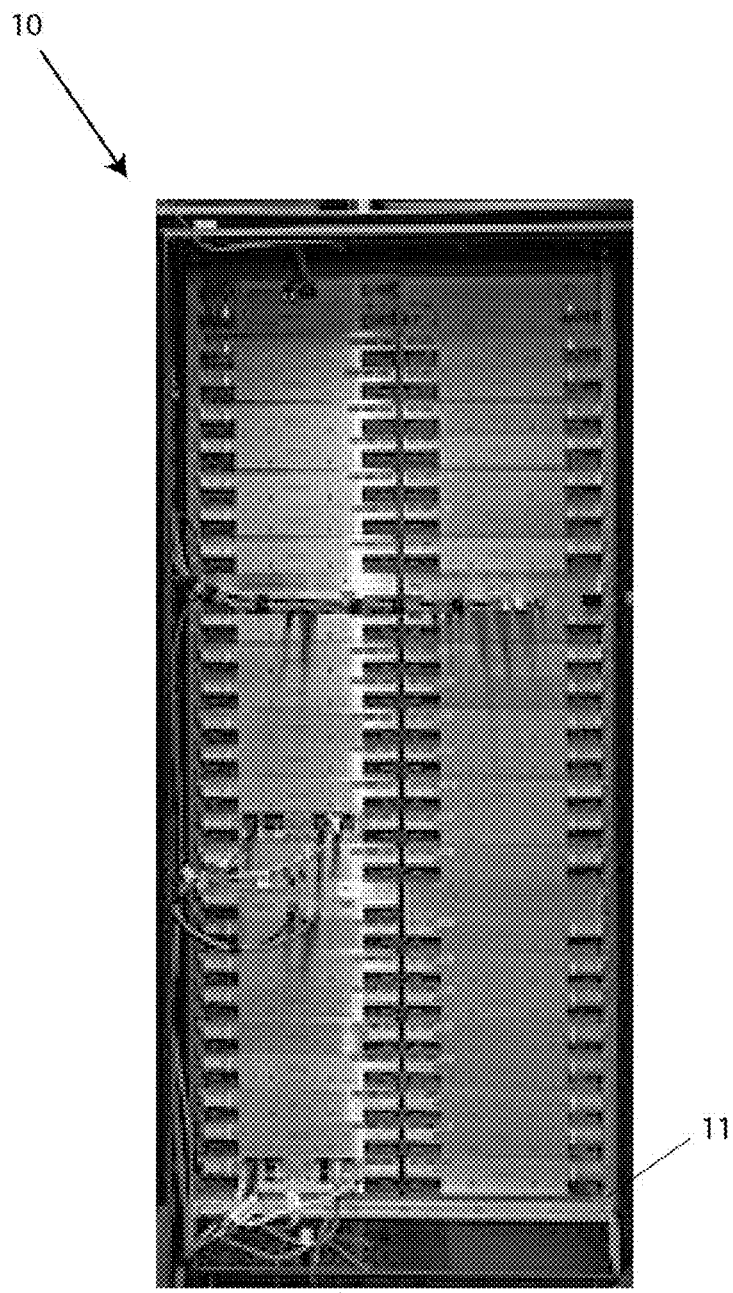
FIG. 1 (Prior Art) is a front view of a CRAY XC040 supercomputer.

Prior art is discussed in reference to FIGS. 1-4 and FIG. 6. FIG. 1 depicts the front side of a CRAY XC040 supercomputer 10 that utilizes a server rack 11 as shown. The model E5-4669v4 supercomputer uses up to 384 64-bit INTEL XEON processors running at 2.2 GHz, and each processor can include up to 22 cores. The volume of the compute cabinet is 176,929 cubic inches, and the volume of the blower cabinet is 60,669 cubic inches for a total volume of 237,598 cubic inches. Power consumed by the compute cabinet is 90 kW in the maximum configuration. The density of processors per unit system volume is 384/237,598 $in^3$ or 0.0016 processors/$in^3$, a computational density to be greatly exceeded using embodiments of the present disclosure.

Figure 2:
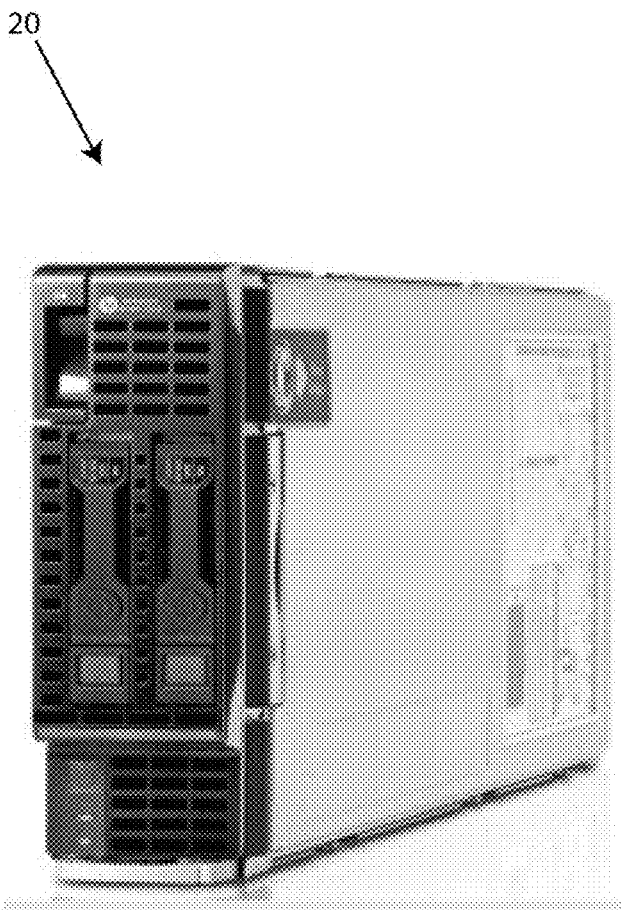
FIG. 2 (Prior Art) is a perspective view of an HP PROLIANT BL460cG8 blade server.

FIG. 2 shows an HP PROLIANT BL460cG8 blade server 20. It has dimensions of 2.2-inch wide, 7.1-inch high, and 20.4-inches deep. It employs dual INTEL OCTA-CORE XEON E5-2660v4 processors running at 2.2 GHz. Each processor die has an area of 306.2 square millimeters and each packaged processor has an area of 2,362 square millimeters, 7.7 times larger or 7.7×. In embodiments of the present disclosure chip-on-board (COB) and chip-on-flex (COF) technologies may be used instead of packaged-device-on-board technology. In the case of blade server 20, an assembly and manufacturing process that uses die rather than packaged devices has an area advantage of 7.7× for each processor. The blade server uses a single printed circuit board having an area of 140 square inches. The number of packaged processor chips per unit system volume is $2/319$ $in^3$=0.0063 processors/$in^3$.

Figure 3:
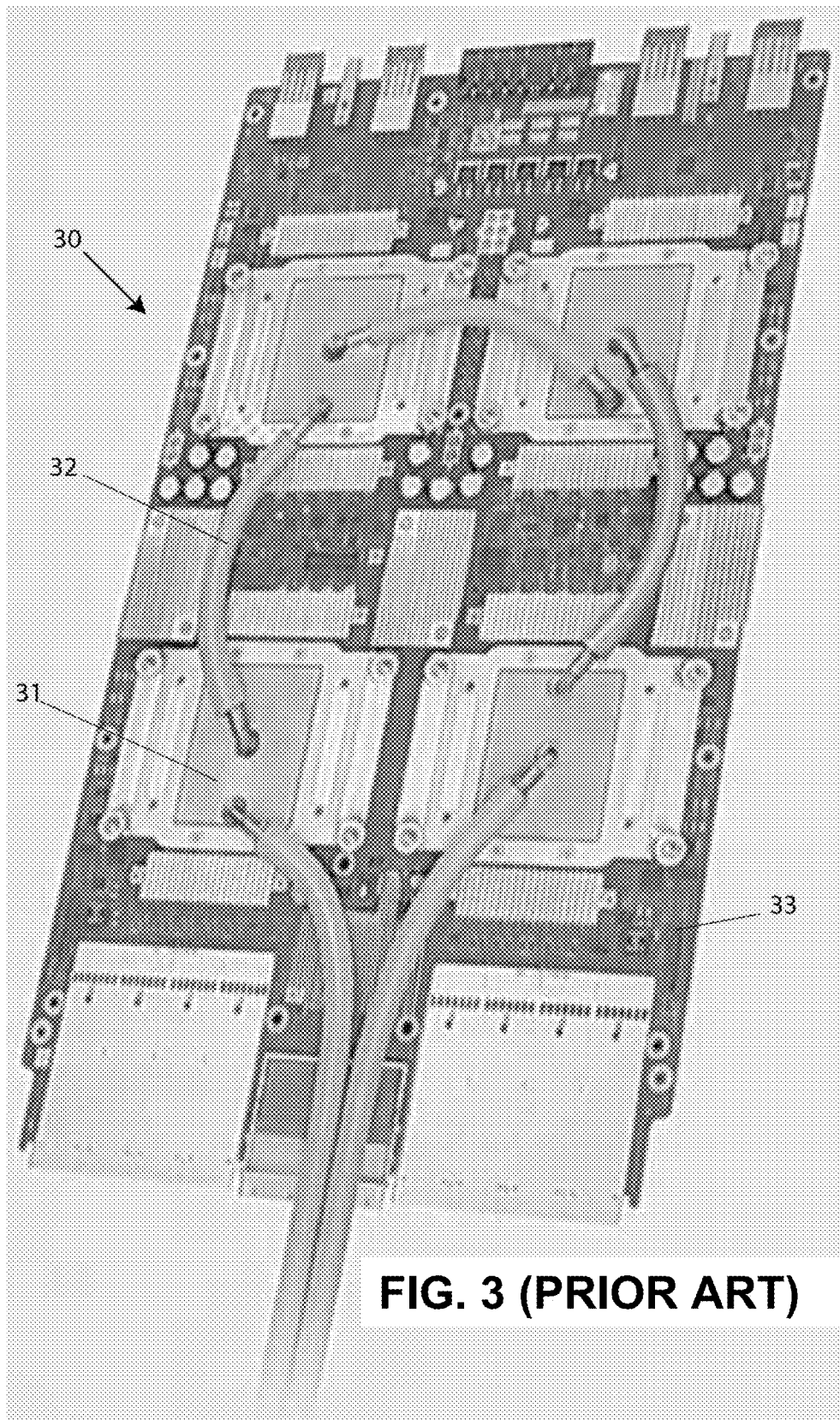
FIG. 3 (Prior Art) is a perspective view of a printed circuit board assembly having four die packages (tensor processing units, GOOGLE TPUs) cooled with tube delivered water.

FIG. 3 shows a water-cooled device 30 used in data centers. Device 30 is a tensor processing unit (TPU v3) implemented with application specific processors 31 tailored for acceleration of artificial intelligence (AI) applications. This third-generation device was announced on May 8, 2018. The tubes 32 circulate cooling water in and out of cavities in the device packages. The devices are mounted on a printed circuit board 33 as shown.

Figure 4:
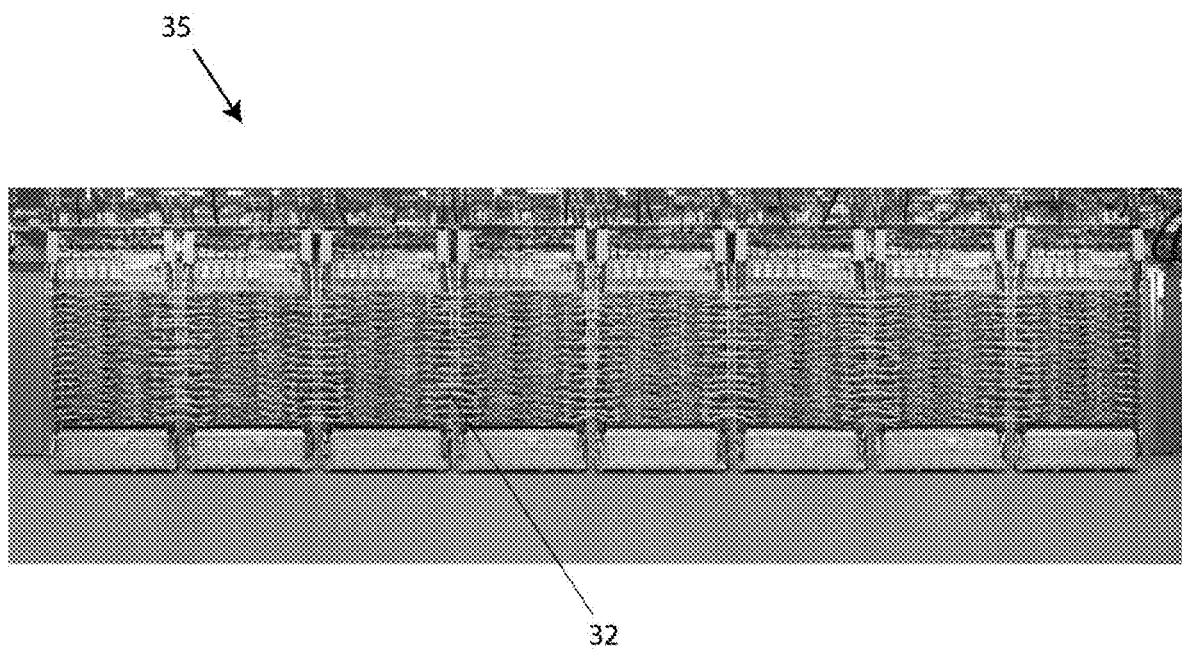
FIG. 4 (Prior Art) depicts a TPU v4 containing up to 1,000 TPU cores.

FIG. 4 shows an array of TPU servers, TPU v4, comprising up to 1,000 TPU cores, as an example of a water-cooled data center configuration. Tubes 32 for carrying water coolant are shown.

Figure 5:
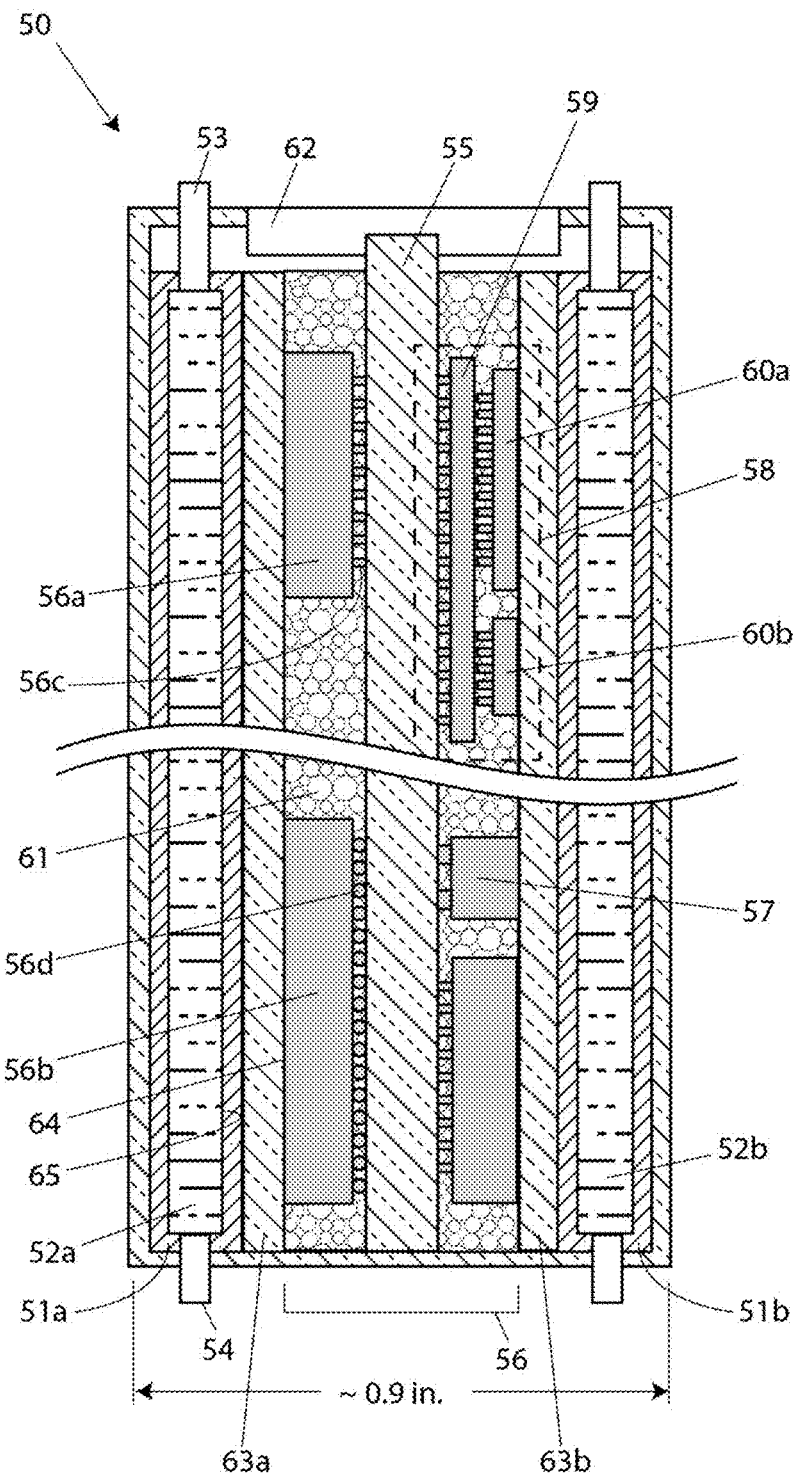
FIG. 5 is a cross-sectional view of a blade server in accordance with an embodiment of the present disclosure.

FIG. 5 shows a blade server embodiment 50 of the present disclosure in cross-section. Blade server 50 includes a pair of tanks 51a and 51b containing a coolant liquid 52a, 52b, each tank having a coolant input 53 and a coolant output 54 for circulating the liquid. The tanks may be comprised of a copper alloy for good thermal conductivity, but any material having high thermal conductivity and compatibility with the chosen coolant may be used. Water may be the chosen coolant for its low cost and good thermal properties. A mixture of water and ethylene glycol may also be used for the coolant. A printed circuit board (PCB) 55 is shown, with flip chip mounted die such as 56a, 56b, a surface mounted device 57, and a stacked device 58. Die 56a is shown with copper pillar terminals 56c. Die 56b is shown with solder ball terminals 56d. Any type of flip chip terminal may be used. Stacked device 58 may comprise an interposer 59 as shown. A powerful processor may require thousands of input/output pins to be connected to the PCB 55. Accordingly, interposer 59 may be used to redistribute a tight pad spacing on a mounted die such as 60a or 60b to a more relaxed pad spacing on PCB 55 as shown in FIG. 5. Interposer 59 may be configured as a chiplet substrate, carrying several interconnected chips. Since interposer 59 may be thin, ~300 µm thick for example, in order for the height of a stacked device to be approximately the same as the height of a silicon bare die it may be useful to use a stiffer substrate material such as silicon carbide (SiC) instead of silicon (Si). The elastic modulus of SiC is around 410 GPa, compared with around 112 GPa for single crystal Si. The PCB 55 may comprise an epoxy-glass laminate such as FR-4, or a flexible sheet of KAPTON as non-limiting examples. PCB 55 with components mounted thereon becomes a printed circuit board assembly (PCBA) 56. PCBA 56 may have components mounted on one or both sides of PCB 55. PCBA 56 may include a planarizing filler material 61 that may be applied by pouring or by screen-printing for example. Filler material 61 is electrically non-conductive and preferably has a high thermal conductivity. An example filler material 61 is SYLGARD 184, a filled silicone elastomer available from Dow, having a thermal conductivity of 0.27 W/m° K. SYLGARD 184 is self-leveling, enabling planarization of PCBA 56 following assembly of the mounted components. It will be appreciated that other filler materials may be used. The mounted components may include processors and memories and power-related devices as examples. Communication-related devices such as controllers for PCI Express or for Gigabit Ethernet may be included. Surface mount devices (SMDs) such as 57 may also be mounted on PCB 55; they may include capacitors and resistors and power-related components as examples. A preferred height for components mounted on a PCBA of the present disclosure may be pre-determined, based on desired cooling properties and assembly considerations. Any component having less than the preferred height when mounted on the PCBA may be used. However, components with mounted heights equal to or close to the preferred height will have respectively the best or close-to-the-best cooling properties, to be further described in terms of the thermal resistance of specific die combinations. Although an SMD may have a larger footprint than the size of a die embedded within it, the SMD footprint is usually small compared with that of a processor die, so its use may not substantially affect the component density on a printed circuit board. It may be convenient for cost reasons and time-to-market reasons to use SMDs rather than develop bare die equivalents. Traces of PCB 55 may connect to terminals of a front panel connector 62 for access to external signals and power.

Printed circuit board assembly 56 is bonded on one side to a wall of cooling tank 51a using a die attach film (DAF) 63a. It is bonded on the other side to a wall of cooling tank 51b using DAF 63b. The DAF is used as a thermal interface material. A suitable die attach film is ESP7666-HK-DAF available in thicknesses of 20 µm and 40 µm from AI Technology, and having a thermal conductivity of 1.8 W/m° K. Other die attach films or pastes may be used, including ones filled with carbon nanotubes or other highly conductive materials for improved thermal conduction. Circuit traces of printed circuit board 55 connect to terminals of a front panel connector 62, providing access to external signals and power. An approximate width for this configuration of blade server 50 is 0.9 inches as shown, potentially compatible with a half-width blade server specification.

In FIG. 5 the back face of each mounted component is attached to a water-cooled tank with only a thin sheet of DAF in between. This provides a favorable form factor for cooling the components, wherein the thermal path comprises an advantageous ratio of (heat sinking area) to (thermal path length).

Regarding the varying heights of assembled components, for the assembly method of the embodiments described herein it is desirable to select a combination of mounting methods that result in reasonably consistent heights among the wide variety of mountable components. When similar heights are selected, the rear face of each component will be close to a heat-sinking surface. The disposition of filler material 61 will be substantially circumferential around the components, rather than adding thermal resistance between the rear face of a component, such as 64, and its corresponding heat sinking surface 65. 300 mm wafers may be around 775 µm thick and 450 mm wafers may be around 950 µm thick. When diced and prepared for assembly, flip chip terminals attached to the die may be copper pillars with a height range of around 30-50 µm, or copper pillar bumps with a height range of 40-100 µm, or solder balls with a diameter range of 60-200 µm for flip chip applications, or 250-760 µm for ball grid array (BGA) and fine pitch BGA applications. Additionally, wafers may be thinned to a desired thickness with a lower limit of around 50 µm. A preferred strategy is to first rank the system components according to their power consumption, each in its system environment with respect to power-relevant parameters such as frequency of operation. Then select an assembly method corresponding to a workable mounted height for the components having the highest power rating. Then select an assembly method corresponding to the same or a lower mounted height for components having the next highest power rating, and so on until all the system components have been accounted for. It may be necessary to iterate the procedure if the lower powered devices end up with a greater mounted height than higher powered devices. This procedure will provide an optimized heat-sinking strategy with respect to component power. In embodiments of the present disclosure, a preferred height in the range of 0.5-2.5 mm for example will make almost no difference to the cooling performance. It will be appreciated that the preferred height may be less than 0.5 mm or greater than 2.5 mm. This insensitivity of cooling performance to preferred height is because the back face of components is already disposed as closely as possible to a heat sinking surface, independently of the preferred height. However, a lower preferred height will result in a more densely packed electronic system having potentially a higher power density in embodiments of the present disclosure.

A worldwide infrastructure exists for semiconductor packaging. There are over 120 OSAT (Outsourced Semiconductor Assembly and Test) companies and over 360 packaging facilities worldwide. Accordingly, it may be possible to use multiple sources for flip chip bumping and flip chip assembly, surface mount assembly, interposers, chiplets and embedded bridges as described herein.

Regarding potential problems arising from thermal expansion effects, the following thermal expansion coefficients are typical: silicon $2.6 \times 10^{-6}/°K$; copper $17 \times 10^{-6}/°K$; FR-4 $11 \times 10^{-6}/°K$ (lengthwise); KAPTON $20 \times 10^{-6}/°K$; alumina (a common substrate material for SMDs) $4.5 \text{-} 11 \times 10^{-6}/°K$; SYLGARD 184 filler $340 \times 10^{-6}/°K$. With respect to the interface between the rear face of a mounted component and a heat sinking surface, the DAF is formulated to handle significant die shear, >2,000 psi for ESP7666-HK-DAF. Considering the mix of materials in a printed circuit board assembly 56, the stresses due to thermal expansion and contraction may be moderate, and heat curing of the filler material may help to relieve stresses incurred during prior assembly steps. Additional annealing steps may further reduce stress in embodiments of the present disclosure. SYLGARD 184 has a durometer of ShoreA 43, representing a soft and compressible material; this may mitigate its high value of thermal expansion coefficient.

The sealed nature of blade server embodiment 50 has advantages in terms of robustness and reliability; however, it may be inherently difficult to repair. For maintainability it may be advantageous to adopt a system level strategy like one that has evolved for flash memories. i.e. provide redundant devices, prepare and maintain a map of the good and bad devices, swap out any malfunctioning devices at the testing stage, and optionally monitor the health of all devices during operation to swap out any devices that have malfunctioned.

Regarding the distribution of power in a printed circuit board assembly of the present disclosure, it may be desirable to regulate power locally using, for example, either power-related bare die or power-related SMDs. The advantageous cooling characteristics of the proposed printed circuit board assemblies may enable higher levels of power dissipation than is customary in power-related components.

Figure 6:
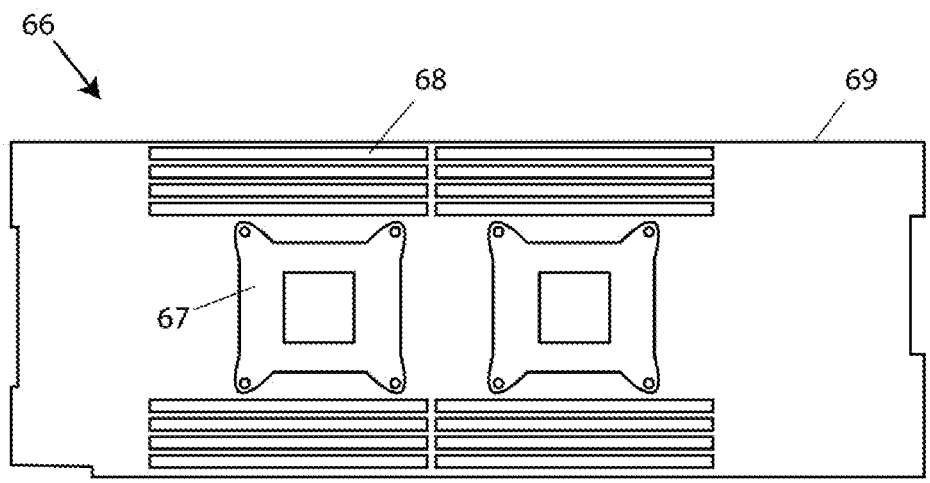
FIG. 6 (prior art) is a partial layout of the printed circuit board in an HP PROLIANT BL460cG8 blade server.

FIG. 6 illustrates the layout 66 of packaged processors 67 and dual inline memory modules (DIMMs) 68 on the printed circuit board 69 of the HP PROLIANT BL460cG8 blade server 20, an example of prior art. The drawing is approximately at ¼ scale. Each DIMM contains 9 DDR3 memory chips, each having a die area of 35 mm². The packaged processors occupy a large fraction of the board space, and this is primarily driven by power consumption. Each XEON E5-2660v4 processor has a thermal design power (TDP) of 105 W, and the peak power may be 20-50% higher. Processors such as these may be designed to slow down if a junction temperature of around 150° C. is exceeded. As previously noted, the number of processor chips per unit system volume is $\frac{2}{319}$ in³=0.0063 processors/in³.

Figure 7:
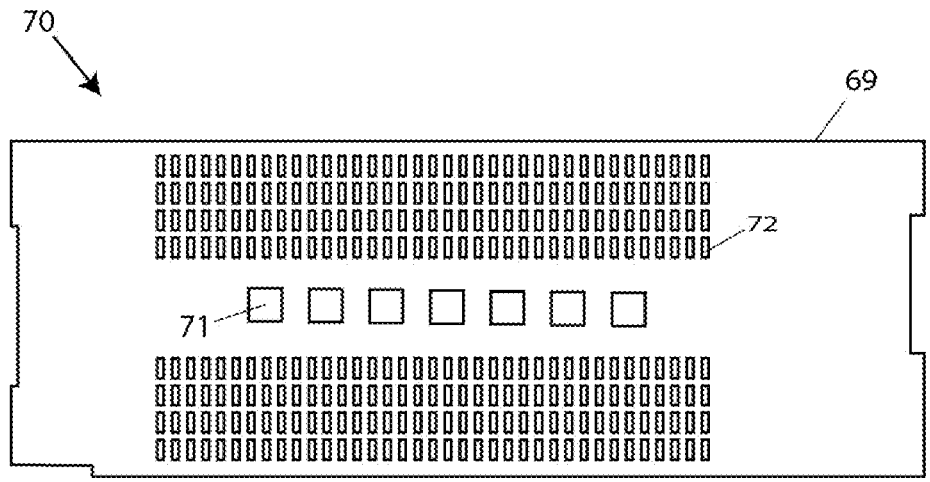
FIG. 7 is a partial layout of the PCB of FIG. 6 using mounted bare die instead of packaged parts in accordance with an embodiment of the present disclosure.

FIG. 7 illustrates a possible board layout of a printed circuit board assembly 70, an embodiment of the present disclosure, using bare die rather than packaged devices. The spaces provided between bare die are estimates only. The same board size 69 and the same processors and memories used in the HP PROLIANT BL460cG8 blade server are used. Each XEON E5-2660v4 processor die 71 has an area of 306.2 mm². Each DDR3 memory chip 72, K4B2G0846D-HCH9, has an area of 35 mm² and a power consumption of around 2.5 W. In one embodiment seven processor die 71 may be placed on each side of PCB 69. The number of processors per unit system volume=14/(1.1×7.1×20.4)=0.089 processors/in³. The layout shows 37×8=296 memory die (per side), or 592 total memory die compared with 144 total die in the sixteen DIMMs 68 of FIG. 6. The total power dissipation of processors and memory per unit system volume calculates as [(14×105 W)+(592×2.5 W)]/159 in³=16.6 W/in³.

Figure 8:
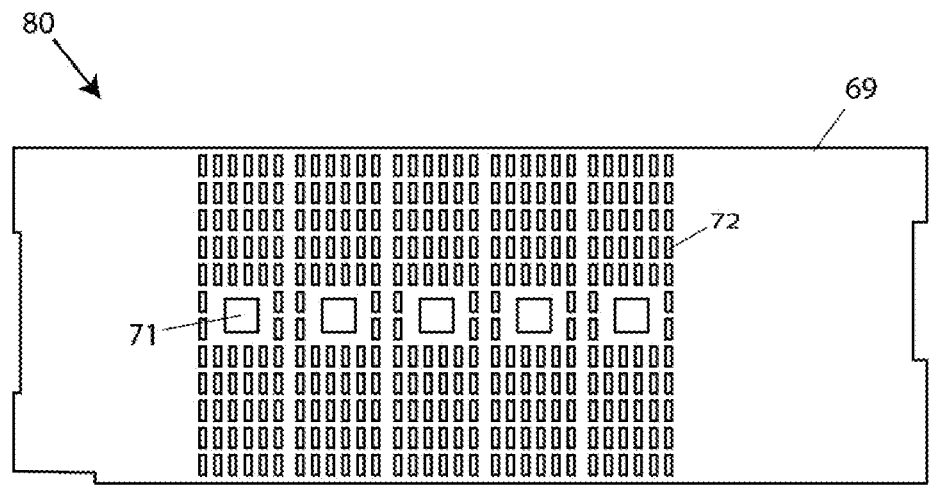
FIG. 8 is an alternative partial layout of the PCB of FIG. 6 using mounted bare die instead of packaged parts in accordance with an embodiment of the present disclosure.

FIG. 8 shows an alternative board layout of a printed circuit board assembly 80, another embodiment of the present disclosure. The same board size 69 and the same processors and memories used in the HP PROLIANT BL460cG8 blade server are used. In one embodiment, five processor chips 71 may be provided on each side of PCB 69, and sixty-four memory die 72 may be provided per processor, as shown in FIG. 8, for a total of 640 memory die per printed circuit board assembly 80. With this layout, the circuit paths connecting processor chips 71 to memory chips 72 are shorter than those in the HP PROLIANT BL460cG8 blade server, and this may lead to higher performance. The total number of processor chips per unit system volume=10/(1.1×7.1×20.4)=0.063.

For higher component and assembly yield, it may be advantageous in a server application to use server chiplets, each server chiplet comprising a processor chip plus a large number of memory chips for example. These chiplets can be tested and validated as high-level components prior to assembly into a PCBA.

The thermal design of the blade server embodiment 50 is now considered. The primary thermal advantage of the proposed bare die configuration is that, at least for the highest power components, the thermal path from each component to cooling water comprises only a thin sheet of die attach film, (DAF) in series with a sheet of copper (a cooling tank wall for example). The best case occurs when a predetermined preferred height is used for a mounted component. If a lower mounted height is used, then the thermal resistance of filler material must be considered, as detailed in reference to FIG. 15. Filler material may be air or SYLGARD 184 or ESP7666-HK-DAF as non-limiting examples. Silicon has a thermal conductivity of 149 W/m° K. Copper has a thermal conductivity of 390 W/m° K. Air has a thermal conductivity of 0.028 W/m° K. SYLGARD 184 has a thermal conductivity of 0.27 W/m ° K. Die attach film ESP7666-HK-DAF 63a, 63b depicted in FIG. 5 and available from Dow has a thermal conductivity of 1.8 W/m° K. It is available in thicknesses of 20 μm and 40 μm. For ease of use, the 40 μm thickness is used in the following calculation of $\theta_{D-W}$, the thermal resistance of the DAF measured between a die such as 56a and cooling water 52a, as shown in FIG. 5. The die area for a XEON E5-2660v4 processor is 236 mm². Thermal resistance $\theta = t/kA$, where t is the thickness in meters, k is the thermal conductivity in W/m° C. and A is the area in m².

In this example wherein the preferred height is used for the mounted component, a silicon die thickness of 775 μm is assumed, and a wall thickness of copper tank 51a is assumed at 1.5 mm:

$$\theta_{D1-W} = \theta_{D1-D2} + \theta_{D2-Cu} + \theta_{Cu-W}$$

$$= 775 \times 10^{-6} m^2 °K / (149W \times 236 \times 10^{-6} m^2) +$$

$$40 \times 10^{-6} m^2 °K / (1.8W \times 236 \times 10^{-6} m^2) +$$

$$1.5 \times 10^{-3} m^2 °K / (390W \times 236 \times 10^{-6} m^2)$$

$$= (0.022 + 0.094 + 0.016)° C./W = 0.132° C./W.$$

Power dissipation P in W between surfaces ΔT° C. apart in temperature and having a thermal resistance of θ between them is:

$$P = \Delta T/\theta.$$

Assuming a conservative maximum die temperature for the processors of 120° C. and assuming the cooling water has a maximum temperature of 40° C., then ΔT equals 80° C. and P=80/0.132=606 W. The high cooling margin in this example may enable the use of higher power chips. Using the PCBA layout of FIG. 7 and employing seven processors per side, the maximum power dissipation using XEON E5-2660v4 processors calculates as 14×105 W=1,470 W. Assuming blade server dimensions of 1.1×7.1×20.4=159/in³, the processor power density in the blade server embodiment 50 is 1,470/159=9.2 W/in³ compared with 210/318=0.66 W/in³ for the HP PROLIANT BL460cG8, an increase of around 14×. Assuming fourteen processors and 1,600 W total power dissipation in the blade server embodiment, the required water flow rate is calculated to be approximately 0.076 gallons per minute or 0.29 liters per minute.

Figure 9:
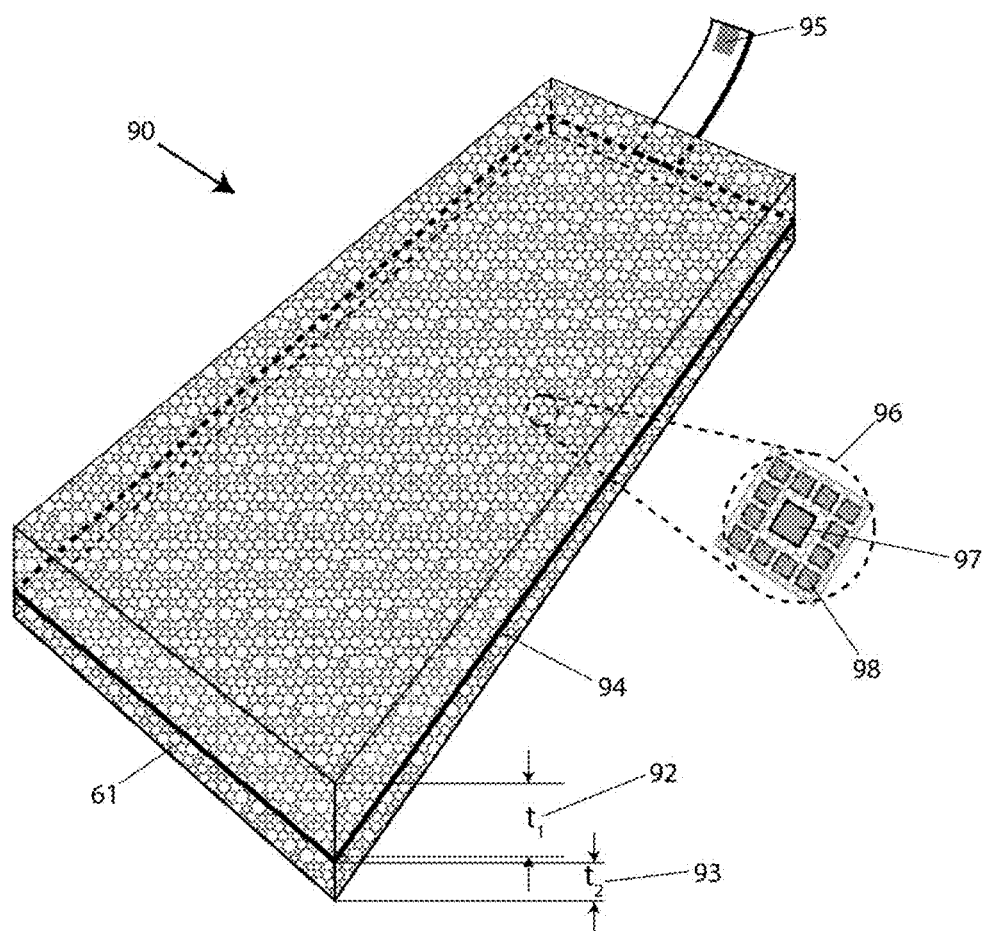
FIG. 9 is a perspective view of a PCBA having the shape of a rectangular prism in accordance with an embodiment of the present disclosure.

FIG. 9 illustrates a PCBA 90 in an embodiment of the present disclosure. Filler material 61 is shown on all sides, after mounting components on each side of a PCB 94, and planarizing each side with the filler 61. A first preferred thickness $t_1$, 92, is shown for component heights on a first side of PCB 94. A second preferred thickness $t_2$, 93, is shown for component heights on a second side of PCB 94. The preferred thicknesses $t_1$ and $t_2$ may be the same, or different as shown. Components may be mounted on both sides of PCB 94 as shown in FIG. 9, or on one side only. Similarly, filler 61 may be provided on one or both sides of PCB 94. PCB 94 is shown as a flex circuit having traces 95 that may be coupled to terminals of a connector for accessing external signals and power. The vertical scale in FIG. 9 is expanded for illustration purposes. Detail 96 is an expanded view of the upper surface of PCBA 90. Detail 96 shows a component 97 with no covering of filler material; accordingly, it will have the lowest thermal resistance and the best cooling performance. Component 97 may be one of the chips in PCBA 90 having a high-power consumption. Component 98 is shown with a thin covering of filler 61; it may have a lower power consumption and may have a lower assembled height. The thermal resistance seen by component 98 will be greater than the thermal resistance seen by component 97, due to the covering of filler material 61. However, because this chip has a lower power dissipation it will be adequately cooled in one of the embodiments described herein.

Figure 10:
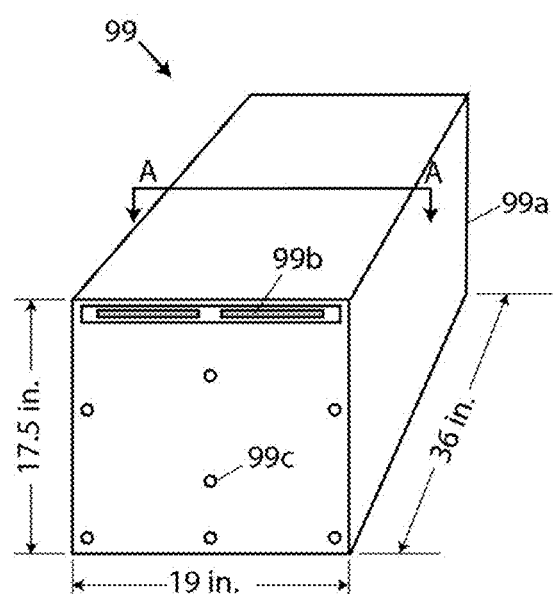
FIG. 10 illustrates an electronic system in accordance with an embodiment of the present disclosure.

Having discussed a blade server embodiment, a larger scale electronic system will now be described. FIG. 10 illustrates a water-cooled electronic system 99 in another embodiment of the present disclosure. Cooling fluids other than plain water may be employed, such as a mixture of water and ethylene glycol. Electronic system 99 is enclosed in a tank enclosure 99a having exemplary dimensions of 19 inches wide, 17.5 inches high and 36 inches deep. A front panel connector 99b is shown, for connecting external signals and power. Water inlet (or outlet) ports 99c are also shown.

Figure 11:
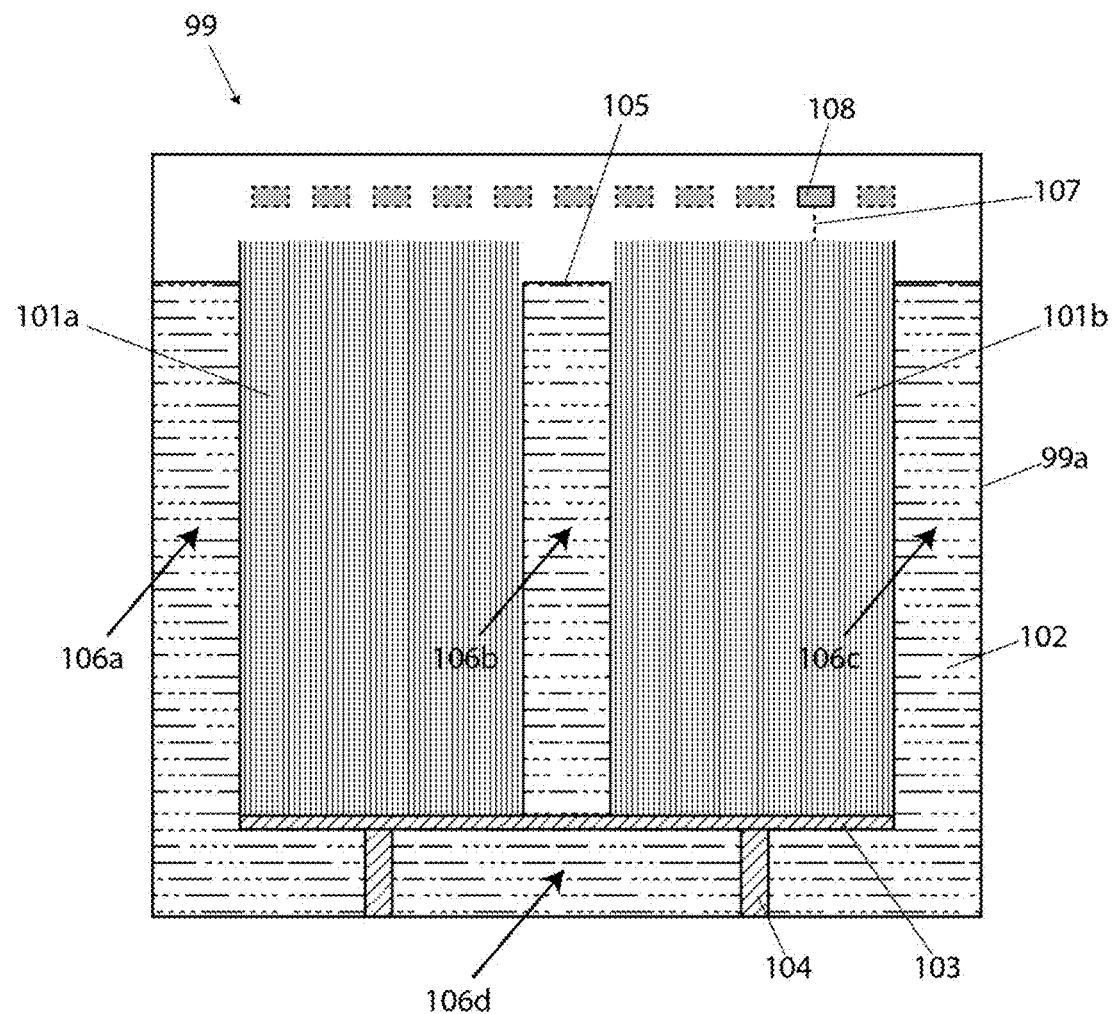
FIG. 11 is a cross-sectional view of the electronic system of FIG. 10 indicated by section AA in accordance with an embodiment of the present disclosure.

FIG. 11 illustrates electronic system 99 as a cross-section that is labeled AA in FIG. 10. Laminate blocks 101a and 101b are shown substantially immersed in water 102 inside tank enclosure 99a. The laminate blocks rest on a baseplate 103 which may be carried by support blades 104. An inner tank 105 is shown. Arrows 106a,b,c,d indicate water flow along longitudinal flow channels provided within tank enclosure 99a. Laminate blocks 101a and 101b comprise laminations of printed circuit assemblies and copper foils, detailed in FIG. 12. Each printed circuit board assembly includes a flexible printed circuit board (flex circuit) having traces indicated by dashed line 107 that connect with a connector 108 whose terminals are coupled to corresponding terminals of front panel connector 99b of FIG. 10.

Figure 12:
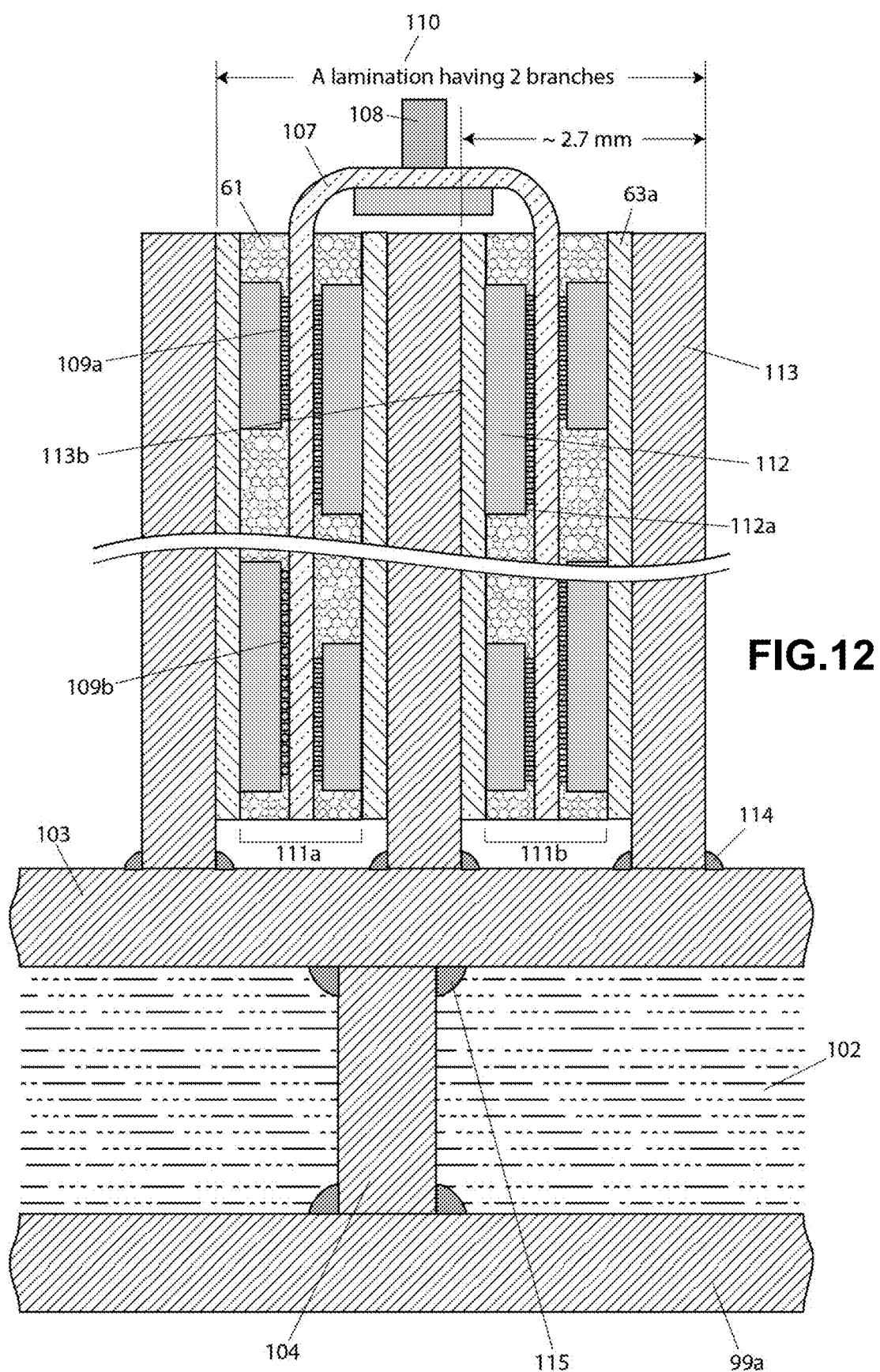
FIG. 12 is an expanded cross-sectional view of a laminate structure in accordance with an embodiment of the present disclosure.

FIG. 12 includes an expanded view of a lamination structure depicted in FIG. 11. A lamination 110 is shown, including a printed circuit board assembly (PCBA) assembled on a flexible substrate 107 and having two branches 111a and 111b. Bare die components such as a processor die 112 are shown flip chip mounted on flexible substrate 107. As previously described, an interposer may be required to redistribute the thousands of points of input/output typically required for a powerful processor chip. Also as previously described, flip chip terminals may be copper pillars such as 109a or solder balls such as 109b, or any other type of flip chip terminal. Parallel sheets of metal foil 113 are shown interleaved with branches 111a and 111b of the PCBA to form repeated laminations 110. As detailed in reference to FIG. 5, assembled components may include bare die, SMDs and stacked devices. The assembled components have a preferred height as previously described. Filler material 61 is also shown, and it has enabled PCBA branches 111a and 111b to be planarized as shown. Die attach film (DAF) 63a is shown, coupling each component to a metal foil 113. Metal foil 113 may comprise a 16 oz copper foil having a thickness of 0.022 inches (0.56 mm) for example, although foil or sheet material of any metal composition and any suitable thickness may be used. Printed circuit board 107 may be a flex circuit as shown and may be fabricated on a KAPTON substrate for example. Other printed circuit board materials and configurations may be used. The base of each copper foil 113 may be soldered 114 to baseplate 103 as shown. Base plate 103 may be soldered 115 to blade 104 that connects with the tank enclosure 99a as shown.

In the lamination 110 of FIG. 12, the thermal resistance from the front face 112a of a die such as 112 to an associated copper foil surface such as 113b is calculated. An assumption is made about the maximum temperature of the copper foil, given the thermal path from an interior point on the foil to the cooling fluid. Again, assume a XEON E5-2660v4 processor having a die thickness of 775 um and an area of 236 mm². Also assume a 40 μm thick layer of die attach film ESP7666-HK-DAF 58.

$$\theta_{D1-W} = \theta_{D1-D2} + \theta_{D2-Cu}$$
$$= 775 \times 10^{-6} m^2 {}^\circ K/(149W \times 236 \times 10^{-6} m^2) +$$
$$40 \times 10^{-6} m^2 {}^\circ K/(1.8W \times 236 \times 10^{-6} m^2) +$$
$$= (0.022 + 0.094 + 0.016)^\circ C./W = 0.132^\circ C./W.$$

Assume that the hottest interior portion of copper foil in a laminate block such as 101a is at 80° C., 40° C. higher than the temperature of the cooling water. If, for a particularly aggressive cooling scheme thermal modeling reveals that the interior portions of a laminate block will get too hot, two remedies may be considered: (i) making the laminate blocks thinner and positioning water cooling tanks between them, or (ii) increasing the thickness of the copper foils. Assuming a maximum die temperature of 150° C., ΔT is calculated as 150–80=70° C. The maximum power dissipation permitted per processor is P=ΔT/θ, =70/0.116=603 W. Although approximate, this again represents a high cooling margin for the assumed XEON E5-2660v4 processor.

Figure 13:
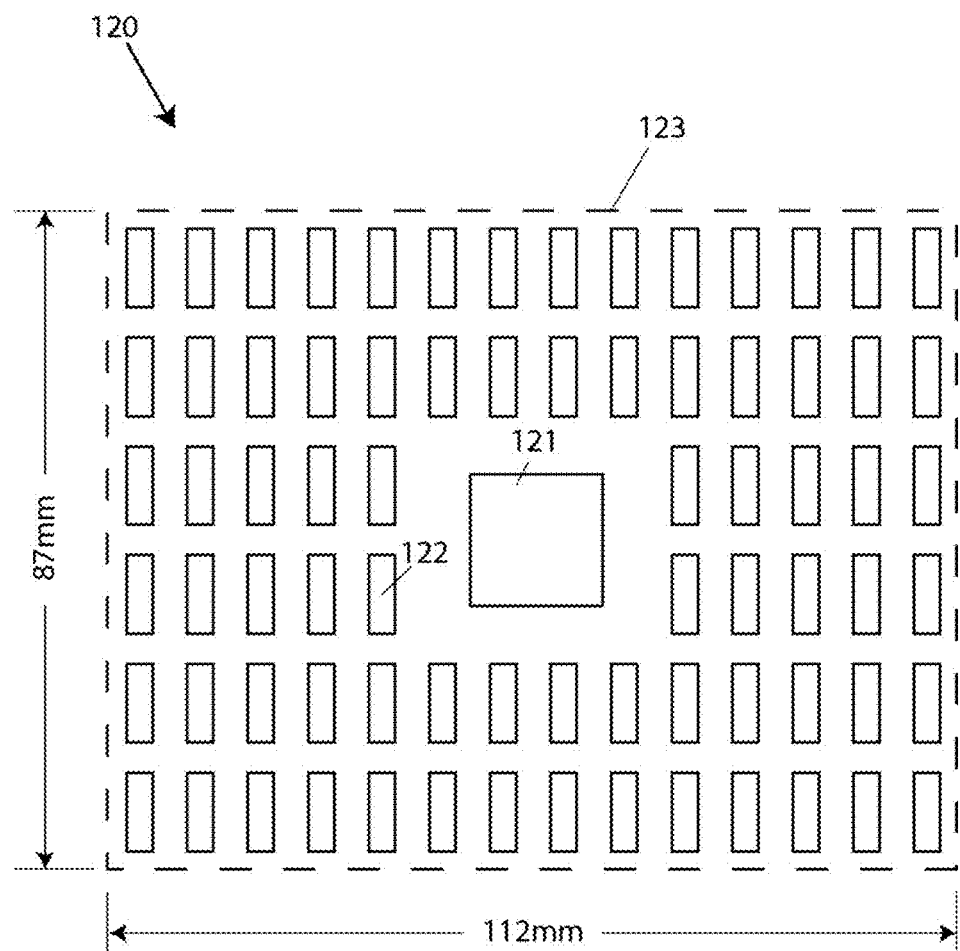
FIG. 13 illustrates at full scale the layout of a processor group or chiplet including one processor die and 76 memory die in accordance with an embodiment of the present disclosure.

FIG. 13 shows a possible layout 120 of a processor group comprising a processor chip 121 assembled with 76 memory die 122 dedicated to the processor. The memory die may be K4B2G0846D-HCH9 (DDR3) chips having an area of 35 mm² for example. Using the XEON E5-2660v4 processor and the DDR3 memory chips, the area 123 of the processor group including the 76 memory chips approximates 112 mm×87 mm or 9,744 mm². The total power consumption for the group may be 105 W for the processor chip and 2.5 W for each memory chip, for a total of 295 W. An alternative to assembly of each individual die in the processor group (one at a time) is to build a chiplet having the same functionality, wherein the chiplet is assembled and tested as a single component. Different chiplets that combine many different chip functions may be used. The types of chips used in chiplets may include processors, memories, power-related chips, communications-related chips, plus chips comprising any other chip function. Using wafer or chip thinning together with judicious selection of the terminal type, e.g. copper pillars or copper pillar bumps or solder balls, a consistent height may be achieved for all the chips in a chiplet. The consistent height for a chiplet is similar in concept to the preferred height for components mounted in PCBAs of the present disclosure, providing for excellent cooling of the chiplet components.

The thickness of a single-branch lamination, as shown in FIG. 12, approximates 2.7 mm. The metal foil thickness may vary from 0.25-2.0 mm for example, resulting in a total thickness of a single-branch lamination in an approximate range of 2.0-3.7 mm. The useful PCBA area per single-branch lamination approximates 328,000 mm² per side. Thus, the total number of processor groups per single lamination approximately equals 328,000/9,744×2 sides=68. The thickness of each block may be 6.5 inches or 165 mm for example. The thickness of each lamination at 2.7 mm leads to 165/2.7×2 blocks=122 laminations total in electronic system 50. Thus, the total number of processor groups per electronic system equals approximately 122× 68=8,296. The total power in the electronic system, using 105 W processor chips and 2.5 W memory chips approximately equals 295 W×8,296=2.45 MW. The flow rate of cooling water required to maintain ΔT of 70° C. approximately equals 133 gallons per minute. The density of processors per unit system volume is calculated as 8,296/11,970=0.69 processors/in³. The total power dissipation per unit system volume=2.45×10⁶ W/11,970 in³=205 W/in³.

FIG. 14 is a flow chart of a method 140 for manufacturing and deploying an electronic system such as electronic system 99 depicted in FIGS. 10-12, according to an embodiment of the present disclosure. Method 140 begins with fabricating an inner structure within an outer tank wherein the inner structure comprises at least one laminate block and each laminate block comprises a repeated lamination of a printed circuit board assembly and a metal foil, step 141. The method continues with, for each repeated lamination, coupling the metal foil to a heat sinking surface, step 142. The final step of the method is circulating a liquid coolant in passages provided between the inner structure and the outer tank, to include flowing liquid coolant past the heat sinking surface, step 143.

A further method is described for manufacturing an electronic system in an embodiment of the present disclosure. The method begins with fabrication of a plurality of flexible PCBs having a top edge, a bottom edge, and two end edges. The method continues with selecting a first plurality of components having approximately a first preferred mounted height to be mounted on a first side of the plurality of flexible PCBs. The method continues with selecting a second plurality of components having approximately a second preferred mounted height to be mounted on a second side of the plurality of flexible PCBs. The method continues with mounting the first and second plurality of components on the first and second sides of the flexible PCB to form a plurality of printed circuit board assemblies (PCBAs). The method continues with overlaying a co-extensive die attach film atop the first and second plurality of components on each side of the PCBAs. The method continues with sizing sheets of metal foil to be co-extensive with the PCBAs except slightly retracted at a top edge, and slightly extended at the bottom edge and two end edges. The method continues with overlaying a sized sheet of metal foil atop the die attach film on each side of each of the plurality of PCBAs to form a plurality of laminate structures, wherein the top edge of the metal foil is slightly retracted compared with the top edge of each of the PCBAs and slightly extended compared with the bottom edge and two end edges of each of the PCBAs. The method continues with aligning and assembling the plurality of laminate structures into one or more laminate blocks. The method continues with heating the one or more laminate blocks to achieve melt-flow of the die attach films. The method continues with cooling the one or more laminate blocks. The method continues with applying solder paste to the three extended edges of the copper foil in each of the one or more laminate blocks. The method continues with positioning the one or more laminate blocks on a base plate. The method continues with heating the one- or more laminate blocks positioned on the base plate to achieve melt-flow of the solder paste and joining of the bottom edge of the copper foil to the base plate and joining of each of the two end edges to an end plate that seals an end of the one or more laminate blocks, preventing water intrusion. The method continues with connecting traces of the PCBA at the extended top edge to a block connector configured for each laminate block. The method finishes with coupling terminals of each laminate block connector to corresponding terminals of a front panel connector or a rear panel connector.

As a measure of computational density, the number of processors per unit system volume as described herein are summarized in Table 1. In each case the processor is a XEON processor running at 2.2 GHz.

TABLE 1

| System | Comp. Density | Advantage |
|---|---|---|
| Cray XC040 supercomputer | 0.0016 | 1X |
| HP Proliant BL460cG8 Blade Server | 0.0063 | 3.9X |
| Blade Server 50 | 0.063 | 39X |
| Electronic System 90 | 0.69 | 431X |

Table 1 indicates the effectiveness of using bare die components or stacked bare die components instead of conventionally packaged die, plus the benefit of a densely packed internal structure integrated with water cooling.

Figure 15:
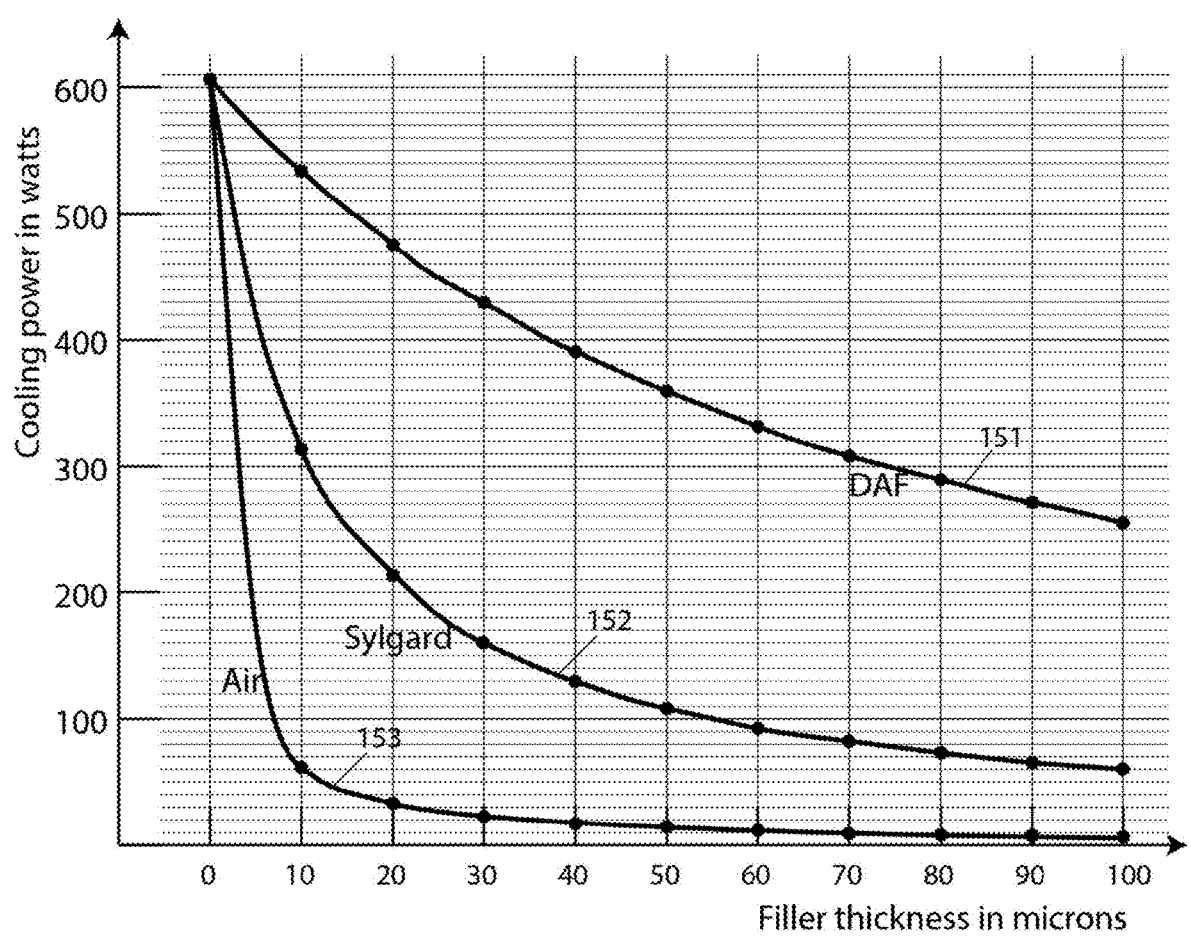
FIG. 15 is a graph of cooling power versus filler thickness for the INTEL OCTA-CORE XEON E5-2660v4 processor chip in accordance with an embodiment of the present disclosure.

A XEON E5-2660v4 processor chip has been shown to have an available power dissipation of 606 W when flip chip mounted as a bare die having the preferred height and no intervening filler material (except for a die attach film) between the back face of the die and a heat sinking surface. The back face of the die is bonded to a wall of a water filled copper tank using die attach film ESP7666-HK-DAF as illustrated in FIG. 5. The effect of mounting this component at less than the preferred height is shown in FIG. 15 where the available cooling power in watts is plotted against filler thickness in microns for two filler materials and for air. The filler materials are disposed in the assembly gap between the back face of the chip and the heat sinking surface. For each curve a 40μ thickness of DAF is assumed in series with the named filler. Curve 151 applies to the use of die attach material ESP7666-HK-DAF as a filler material, wherein multiple sheets of the material may be stacked to achieve a desired thickness. Curve 152 applies to the use of SYL-GARD 184 as a filler material. Curve 153 applies to the use of air as a filler material. Other filler materials may be used, especially those with high thermal conductivity. It is desirable that air bubbles be removed; this may be achieved using a vacuum process, applied while the filler is in liquid form for example. Filler thickness is a measure of the difference between an actual component height and the preferred height.

FIG. 15 shows that the choice of filler material is critical, and that air is a poor choice. Since the cooling performance varies dramatically with filler thickness, and the desired thicknesses may be difficult to achieve in practice, FIG. 15 also shows that assembly precision is required in order to reap the benefits of a preferred height strategy described herein. For good cooling performance a component must be mounted at the preferred height or close to it, as shown in the graph. While the mounting height may be non-critical for a low-power device like a dynamic RAM with a rated power of around 2.5 W for example, being close to the preferred height is critical for high-power components. For example, any component of a PCBA having a power rating of at least 50 W may have a mounted height in the range of 90-100% of the preferred height. To help achieve the desired assembly precision, excess filler material may be applied, then material removed using a grinding process or a polishing process or a chemical mechanical polishing (CMP) process or a combination of these processes, until the back face of the highest-power components is exposed, and a polished planar surface of the PCBA is available for bonding to a heat sinking surface. In addition to removal of filler material, semiconductor material may also be removed from the back side of high-powered components, to overcome any small differences in mounted height (due to assembly tolerances for example), or any planarity variations, again due to assembly tolerances for example.

In embodiments of the present disclosure chiplets may be fabricated in accordance with a preferred height strategy determined for a host PCBA. Techniques including filling, grinding and polishing and removal of semiconductor material may be applied to the construction of chiplets, as described herein for PCBAs, according to embodiments of the present disclosure.

As will be understood by those familiar with the art, the invention may be embodied in other specific forms without departing from the spirit or essential characteristics thereof. Likewise, the particular naming and division of the members, features, attributes, and other aspects are not mandatory or significant, and the mechanisms that implement the invention or its features may have different structural construct, names, and divisions. Accordingly, the disclosure of the invention is intended to be illustrative, but not limiting, of the scope of the invention.

While the invention has been described in terms of several embodiments, those of ordinary skill in the art will recognize that the invention is not limited to the embodiments described but can be practiced with modification and alteration within the spirit and scope of the appended claims. Another embodiment may comprise air as a coolant fluid for example. The description is thus to be regarded as illustrative instead of limiting. There are numerous other variations to different aspects of the invention described above, which in the interest of conciseness have not been provided in detail. Accordingly, other embodiments are within the scope of the claims.

The invention has been described in relation to particular examples, which are intended in all respects to be illustrative rather than restrictive. Those skilled in the art will appreciate that many different combinations will be suitable for practicing the present invention. For example, assembly details for a PCBA of the present disclosure may be applied to either a blade server or an electronic system of the present disclosure. Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A printed circuit board assembly (PCBA) comprising:
   a substrate;
   a plurality of electronic components assembled on the substrate using flip chip assembly methods, wherein the plurality of electronic components are selected from bare die, surface mount devices, and stacked devices;
   a filler disposed between the plurality of electronic components;
   wherein a preferred height is predetermined for at least one of the plurality of electronic components, the preferred height corresponding to one or more of the plurality of electronic components having a high power rating;
   wherein the filler and the plurality of electronic components are ground or polished to form a polished planar surface having a height equal to the preferred height.

2. The printed circuit board assembly of claim 1, wherein the stacked devices comprise an interposer, a chiplet, or an embedded bridge.

3. The printed circuit board assembly of claim 1, wherein the substrate comprises traces that are coupled to corresponding terminals of a PCBA connector.

4. The printed circuit board assembly of claim 1, further comprising:
   a metal member having a length and a width approximately co-extensive with a length and width of the printed circuit board assembly;
   thermal interface material coupled to the metal member;
   wherein at least one of the plurality of electronic components comprises at least one high-power component, and wherein a back face of the at least one high-power component is coupled to the metal member using the thermal interface material to form a lamination of the printed circuit board assembly and the metal member.

5. The printed circuit board assembly of claim 1, wherein the preferred height is 2.5 mm.

6. A printed circuit board assembly (PCBA) comprising:
   a substrate;
   a plurality of electronic components assembled on the substrate using flip chip assembly methods, wherein the plurality of electronic components are selected from bare die, surface mount devices, and stacked devices;
   wherein a preferred height is predetermined for at least one of the plurality of electronic components, the preferred height corresponding to one or more of the plurality of electronic components having a high power rating;
   a metal member having a length and a width approximately co-extensive with a length and width of the printed circuit board assembly;
   thermal interface material coupled to the metal member;
   wherein at least one of the plurality of electronic components comprises at least one high-power component, and wherein a back face of the at least one high-power component is coupled to the metal member using the thermal interface material to form a lamination of the printed circuit board assembly and the metal member.

7. The printed circuit board assembly of claim 6, wherein the thermal interface material comprises a die attach film.

8. The printed circuit board assembly of claim 6, wherein the thermal interface material has a thickness less than 50 microns.

9. The printed circuit board assembly of claim 1, wherein the preferred height is in the range of 0.5-3.0 mm.

* * * * *